United States Patent [19]
Segawa et al.

[11] Patent Number: 5,428,244
[45] Date of Patent: Jun. 27, 1995

[54] SEMICONDUCTOR DEVICE HAVING A SILICON RICH DIELECTRIC LAYER

[75] Inventors: Mizuki Segawa, Kyoto; Yoshiaki Kato, Hyogo; Hiroaki Nakaoka, Osaka, all of Japan

[73] Assignee: Matsushita Electric Industrial Co., Ltd., Osaka, Japan

[21] Appl. No.: 82,357

[22] Filed: Jun. 28, 1993

[30] Foreign Application Priority Data

Jun. 29, 1992 [JP] Japan ................... 4-170360

[51] Int. Cl.⁶ .............. H01L 29/34; H01L 27/02; H01L 23/48
[52] U.S. Cl. ................... 257/646; 257/382; 257/383; 257/384; 257/388; 257/413; 257/753; 257/755; 257/757
[58] Field of Search ............... 257/382, 383, 384, 388, 257/389, 411, 412, 413, 646, 753, 754, 755, 757

[56] References Cited

U.S. PATENT DOCUMENTS 5,248,892 9/1993 Van Roozendaal ............... 257/384

FOREIGN PATENT DOCUMENTS 63-284857 11/1988 Japan .
63-316476 12/1988 Japan .
 0125572  1/1989 Japan .

Primary Examiner—Robert P. Limanek
Assistant Examiner—Valencia Martin Wallace
Attorney, Agent, or Firm—Willian Brinks Hofer Gilson & Lione

[57] ABSTRACT

The adhesion between a metallic silicide film and a dielectric layer of a semiconductor device is improved. Formed on a silicon substrate is a gate dielectric layer formed on which is a metallic silicide film. A silicon dielectric layer of a rich-in-silicon-content type, which have a silicon content higher than a silicon content according to the stoichiometric composition formula, is deposited on the metallic silicide film. Because of this arrangement, a semiconductor device which is free from film peeling and which has an electrode wire with a low electrical resistance is achievable without decreasing the concentration of impurity at an electrode. If a passivation silicon oxide layer whose composition is close to a composition according to the stoichiometric composition formula is formed on the silicon oxide layer of a rich-in-silicon-content type, the degradation of the inside of an electrode, and the degradation of a gate oxide layer both caused by unwanted impurities from the outside can be prevented. This invention is available not only to a silicon oxide layer but also to a silicon nitride layer.

7 Claims, 12 Drawing Sheets

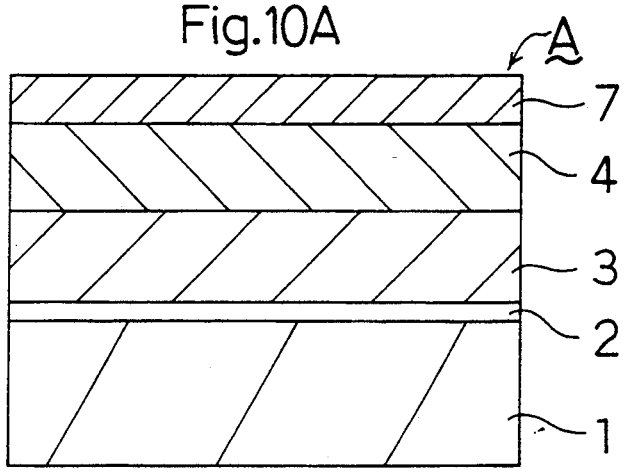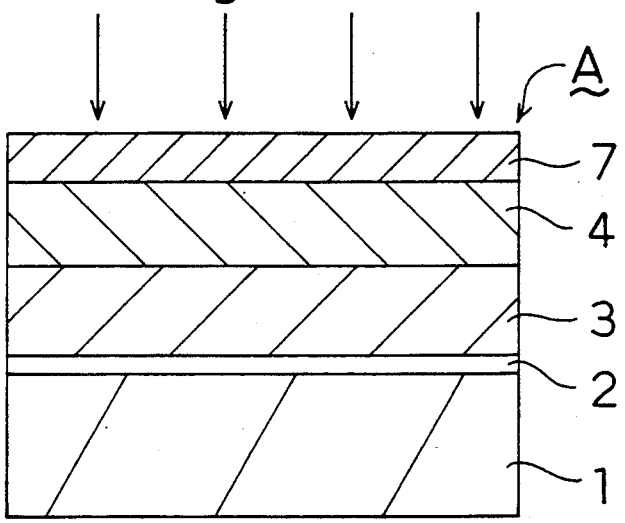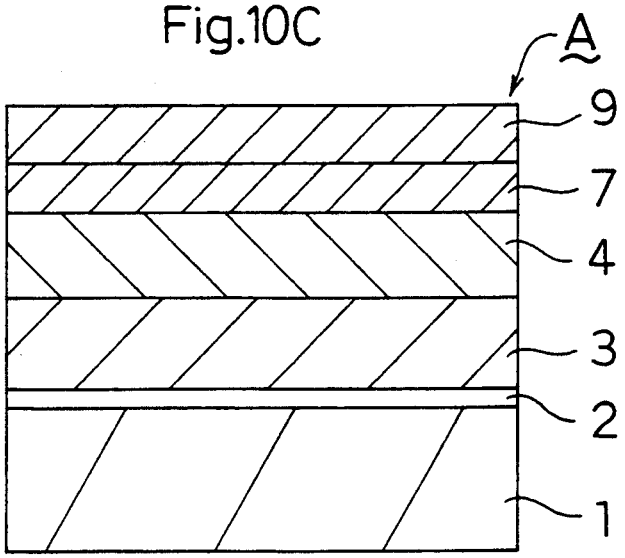

SEMICONDUCTOR DEVICE HAVING A SILICON RICH DIELECTRIC LAYER

BACKGROUND OF THE INVENTION

This invention pertains to semiconductor device which make use of metallic silicides to form a layer serving as an electrode or as a wire, and it further pertains to a process of fabricating such semiconductor devices. More particularly, this is an invention in technology for the adhesion promotion between a metallic silicide film and an overlaying dielectric layer.

Generally, in semiconductor devices of very large scale integration (VLSI), their operating speed much depends on the resistivity of a material of a wire used to transmit a signal from one circuit component to the other. Accordingly, it is most desired that wiring material, which serves as transistor electrode or as a direct intrachip connection, is a low-resistivity material. For this reason, metallic silicides are an attractive wiring material, having a low resistivity as compared to polycrystalline silicon (polysilicon). The effect of using metallic silicides gives a further advantage that the cost of forming wiring layers can be kept low, compared to multilayering metal layers. Metallic silicides have been used increasingly as wiring materials in the semiconductor manufacturers.

Various metallic silicides, which melt at high temperatures, are known, some of which are molybdenum silicide (MoSix), titanium silicide (TiSix), and tungsten silicide (WSix). These metallic silicides have a lower resistivity than polysilicon, and the use of metallic silicides makes the process of forming a wiring layer easier. However, metallic silicides are likely to be oxidized. Further, metallic components of silicides (for example, tungsten) are diffused into an oxide layer and react chemically with another element. This presents several problems. For example, the property of a semiconductor element is degraded. Further, unwanted film peeling occurs. To cope with these problems, a polysilicon layer is intervened between a dielectric layer and a metallic silicide film for isolation.

FIG. 16 is an example showing in cross section a first conventional MOS semiconductor device employing a metallic silicide film. A gate dielectric layer 2 (5 to 16 nm thick) formed by silicon dioxide (SiO$_2$)) is grown on a silicon substrate 1 by means of oxidation. A polysilicon layer 3 (50 to 200 nm thick) is formed on top of the gate dielectric layer 2. Then, the polysilicon layer 3 is subjected to an ion implantation with gate impurities (for example, arsenic ions) at an implantation energy of 40 keV at a dose of 4 to 8×10$^{15}$ cm$^{-3}$. A tungsten silicide (WSix) film 4 (50 to 200 nm thick) is deposited on the polysilicon layer 3. Then, a silicon oxide layer 5 (50 to 200 nm thick), formed by silicon dioxide (SiO$_2$), is formed by means of a chemical vapor deposition (CVD) process. After the step of transferring patterns is completed, the polysilicon layer 3, the WSix film 4, and the silicon oxide layer 5 are etched sequentially, thereby forming a gate electrode. Further, at a later step, a heat treatment is carried out at 850° to 950° C. for the activation of the impurities, the crystallization of the WSix film 4, and the planarization of the interlevel layer.

If the gate dielectric layer 2 directly contacts with the WSix film 4, the chemical reaction of tungsten with silicon dioxide occurs. This presents problems. For example, a gate-to-source (or gate-to-drain) leakage current occurs. Further, the reliability of gate dielectric layers falls. To overcome such problems, the polysilicon layer 3 doped with impurities is inserted between the WSix film 4 and the gate dielectric layer 2, and the polysilicon layer 3 and the WSix film 4 as one integral body constitute a gate electrode.

The effect of forming the silicon oxide layer 5 on the surface of the WSix film 4 gives several advantages. Without the provision of the silicon oxide layer 5 on the WSix film 4, the WSix film 5 will be oxidized immediately during a later heat treatment. This causes short between wires and between a source and a drain. Further, impurities to a gate are prevented at the time of another ion implantation.

Japanese Patent Application (Pub. No. 63-76479) attempts to prevent a tungsten silicide film from being oxidized by the deposition of a polysilicon layer (or an amorphous silicon layer) on the tungsten silicide film. This, however, leaves the polysilicon layer on the surface of the tungsten silicide film, requiring the provision of an electrical contact with a wire in the polysilicon layer. Due to the existence of an electrical contact, it may not be possible to make good use of an advantageous nature inherent in metallic silicides (i.e. a low resistivity). This is why a silicon oxide layer is deposited on the surface of a metallic silicide film.

The doping profiles, from the silicon oxide layer 5 towards the silicon substrate 1, of oxygen and arsenic (n-type impurities) are shown in FIG. 17. N-type impurities such as arsenic ions are likely to aggregate at the interface between an oxide layer and another different layer. As seen from FIG. 17, the arsenic concentration is high at the interface between the gate dielectric layer 2 and the polysilicon layer 3 as well as at the interface between the WSix film 4 and the silicon oxide layer 5.

FIG. 20 is similar to FIG. 16 but shows the doping profiles of oxygen and boron (p-type impurities) when boron ions are used as gate impurities. As shown in FIG. 20, the post-heat-treatment population of boron ions in the WSix film 4 and the post-heat-treatment population of boron ions in the polysilicon layer 3 differ from those of arsenic ions as shown in FIG. 16. In other words, boron aggregates at the interface between the WSix film 4 and the silicon oxide layer 5, and the boron concentration is low particularly in the polysilicon layer 3. This is explained as follows. Since there exists a great difference in heat shrinkage between the WSix film 4 and the silicon oxide layer 5, the interface between the WSix film 4 and the silicon oxide layer 5 is stressed intensively, and thus the structure of the WSix film 4 in the vicinity of the interface becomes disordered. Boron is likely to aggregate in such a structure-disordered zone. Further, compared to the WSix layer 4, the solid solubility of boron in the polysilicon layer 3 is small so that boron in the polysilicon layer 3 is dissolved into the WSix film 4. This results in the decrease of the boron concentration in the polysilicon layer 3. To sum up, boron is more likely to aggregate towards the interface in comparison with arsenic.

In this prior art technique, a WSix film is partly used as an gate electrode. However, a molybdenum silicide film or a titanium silicide film may be employed and formed by the same process as a WSix film.

FIG. 18 is an example showing in cross section a second conventional semiconductor device. After the deposition of the WSix film 4, a silicon nitride layer 6 (50 to 200 nm thick) is formed. In other words, the silicon nitride layer 6 replaces the silicon oxide layer 5 of the first conventional semiconductor device. The doping profiles, from the silicon nitride layer 6 to the silicon substrate 1, of nitrogen and arsenic are shown in FIG. 19. Like FIG. 17, the arsenic concentration is high at the interface between the gate dielectric layer 2 and the polysilicon layer 3 as well as at the interface between the WSix film 4 and the silicon nitride layer 6. Accordingly, the second conventional semiconductor device has the same tendency as the first conventional semiconductor device.

If a silicon oxide layer is formed on the surface of a metallic silicide film (for example, a WSix film), film peeling is likely to occur for the following reasons.

(1) The gate impurities, implanted into the WSix film 4 at the forgoing step, are diffused into the vicinity of the interface between the WSix film 4 and the silicon oxide layer 5, and aggregate there, during a later heat treatment. Because of this aggregation of the gate impurities, tungsten in the WSix film 4 is unlikely to react chemically with silicon in the silicon oxide layer 5. This results in poor adhesion between these two layers, and peeling is likely to occur. To avoid such unwanted peeling, it is necessary to limit the dose of gate impurity. If the dose of gate impurity is limited, however, a gate becomes depleted and characteristics are degraded for the case of a MOS semiconductor device. The boron concentration in the polysilicon layer 3 particularly decreases if p-type gate impurities are used, so that, for the case of p-channel MOS semiconductor devices of a surface channel type, gate depletion particularly becomes serious.

(2) If an implantation of gate impurities is carried out directly from above the WSix film 4, this roughens the surface of the WSix film 4, leaving such a roughened surface exposed. Consequently, this leads to abnormal oxidization at a later heat treatment or oxidization step.

The same problems also arise when using a molybdenum silicide layer or titanium silicide layer and when using a silicon nitride layer.

SUMMARY OF THE INVENTION

Bearing in mind the above-described problems, the present invention was made. It is an object of the present invention to provide an improved semiconductor device and a process thereof. In accordance with this invention, (1) a high melting-point metallic silicide film is formed above a semiconductor substrate, (2) formed on the surface of the metallic silicide film is a dielectric layer formed by a silicon compound, and (3) such a dielectric layer has a silicon content higher than a silicon content according to the stoichiometric composition formula, whereby adhesion between the metallic silicide film and the dielectric layer can be improved.

The present invention provides a first means. In accordance with this means, a semiconductor device comprises (a) a metallic silicide film, which is formed above a semiconductor substrate and is composed of a first chemical compound of silicon and a metallic element having a high melting point such as tungsten, molybdenum, and titanium, and (b) a Si-rich dielectric layer, which is formed on the metallic silicide film, is composed of a second chemical compound of a silicon element and a different element, and has a silicon content higher than a silicon content according to the stoichiometric composition formula of the second chemical compound.

The operation of the first means is described. Since silicon atoms in the Si-rich dielectric layer have excessive vacancies for further chemical bond to incoming impurities from the metallic silicide film, such impurities do not collect at the interface between the metallic silicide film and the Si-rich dielectric layer but are diffused into the Si-rich dielectric layer. Therefore, the level of impurity concentration is kept low at the interface, and the chemical reaction between a high melting-point metal and silicon occurs without any interference by impurities. As the silicon content of the Si-rich dielectric layer increases, the composition thereof approaches the composition of polysilicon. This means that the difference in heat shrinkage between the Si-rich dielectric layer and the metallic silicide film becomes smaller than the difference in heat shrinkage between a dielectric layer having a composition according to the stoichiometric composition formula and a metallic silicide film. Therefore, good adhesion is achievable between a metallic silicide film and a Si-rich dielectric layer.

The present invention provides a second means. In accordance with this means, the foregoing metallic silicide film is deposited on a polysilicon layer, and the polysilicon layer and the metallic silicide film as one integral body function as an electrode or as a wire.

The operation of the second means is described. When an electrode or a wire with a polycide structure is formed by depositing a metallic silicide film on a polysilicon layer, p-type impurities are likely to be diffused into the metallic silicide film from the polysilicon layer, and such p-type impurities are much likely to aggregate at the interface between the metallic silicide film and the overlying dielectric layer. In accordance with the invention, however, the aggregation of impurities towards the interface can be avoided, since the impurities find it easy to be diffused into the Si-rich dielectric layer. Likewise, good adhesion is achievable.

The present invention provides a third means. In accordance with this means, a dielectric layer serving as a passivation film is provided, which is formed on the foregoing Si-rich dielectric layer, is composed of the chemical compound as the Si-rich dielectric layer, and has a silicon content closer to a silicon content according to the stoichiometric composition formula, compared to the Si-rich dielectric layer.

The operation of the third means is described. The passivation dielectric layer does not have excessive vacancies for further chemical bond. Accordingly, the upward diffusion of metallic components from the metallic silicide layer and impurities diffused from below is prevented while at the same time impurities from the outside is prevented. As a result, the characteristic of each portion of a semiconductor device is well kept.

The present invention provides a fourth means. In accordance with this means, the silicon content of the foregoing Si-rich dielectric layer increasingly approaches a silicon content according to the stoichiometric composition formula in a direction from bottom to top of the Si-rich dielectric layer.

The present invention provides a fifth means. In accordance with this means, the Si-rich dielectric layer is a silicon oxide layer whose stoichiometric composition formula is $SiO_2$ with an excessive silicon content.

The present invention provides a sixth means. In accordance with this means, the Si-rich dielectric layer is a silicon nitride layer whose stoichiometric composition formula is $Si_3N_4$ with an excessive silicon content.

The present invention provides a seventh means. In accordance with this means, when a semiconductor device is a CMOS transistor, a gate dielectric layer is formed on the semiconductor substrate, and a polysilicon layer is formed on the gate dielectric layer, wherein the metallic silicide film is deposited on the polysilicon layer, and the polysilicon layer and the metallic silicide film function as a gate electrode of the CMOS transistor.

The present invention provides an eighth means. In accordance with this means, a semiconductor device is fabricated on a semiconductor substrate by (a) forming a metallic silicide film having a high melting point above the semiconductor substrate, and (b) forming a Si-rich dielectric layer, which is composed of a compound of silicon and a different element, and which has a silicon content higher than a silicon content according to the stoichiometric composition formula of the chemical compound.

The present invention provides a ninth means. In accordance with this means, after the formation of a Si-rich silicon dioxide layer whose stoichiometric composition formula is $SiO_2$ with an excessive silicon content, the metallic silicide film is subjected to an ion implantation with impurity ions upon completion of the formation of the silicon dioxide layer, and the upper portion of the silicon dioxide layer is subjected to an oxidizing treatment upon completion of the ion implantation.

The present invention provides a tenth means. In accordance with this means, after the formation of a Si-rich silicon nitride layer whose stoichiometric composition formula is $Si_3N_4$ with an excessive silicon content, the metallic silicide film is subjected to an ion implantation with impurity ions upon completion of the formation of the silicon nitride layer, and the upper portion of said silicon nitride layer is subjected to nitriding upon completion of the ion implantation.

The operation of the ninth and tenth means is described. If the step of forming a metallic silicide film must be carried out before an ion implantation for some reason, the surface of the metallic silicide film will not be roughened because a Si-rich silicon oxide layer or a Si-rich silicon nitride layer has already been deposited on the metallic silicide film. Accordingly, abnormal oxidization is unlikely to occur at a later thermal treatment and at a later oxidizing step.

The present invention provides an eleventh means. In accordance with this means, a semiconductor device is fabricated on a semiconductor substrate by (a) forming a WSix layer on the semiconductor substrate by means of pyrolysis of mixed gases of $SiH_2Cl_2$ gas and $WF_6$ gas, and (b) depositing, after the supply of $WF_6$ gas is brought to a halt and the introduction of $N_2O$ gas starts, a silicon oxide layer on the WSix film by means of pyrolysis of mixed gases of $SiH_2Cl_2$ gas and $N_2O$ gas.

The present invention provides a twelfth means. In accordance with this means, a semiconductor device with semiconductor elements In a semiconductor substrate is fabricated by (a) forming a WSix layer on the semiconductor substrate by means of pyrolysis of mixed gases of $SiH_2Cl_2$ gas and $WF_6$ gas, and (b) depositing, after the supply of $WF_6$ gas is brought to a halt and the introduction of $NH_3$ gas starts, a silicon nitride layer on the WSix film by means of pyrolysis of mixed gases of $SiH_2Cl_2$ gas and $NH_3$ gas.

The operation of the eleventh and twelfth means is described. Since a WSix film and a silicon oxide (or a silicon nitride) are formed of mixed gases including $SH_2Cl_2$ gas, this allows these layers to be deposited at almost the same temperature. As a result, the difference in heat shrinkage between the layers becomes smaller. Further, the layers can be continuously deposited in the same deposition reactor. This makes it possible to cover the surface of a WSix layer with an oxide or nitride layer, without exposure to the atmosphere, before grain growth by crystallization starts. Thus, the WSix layer becomes free from abnormal oxidization. Accordingly, the destruction of crystal grains due to such abnormal oxidization can be avoidable.

BRIEF DESCRIPTION OF THE, DRAWINGS

In the drawings:

FIGS. 10A to 10C are cross sectional views of a semiconductor device of a fifth example of the invention, showing the steps in the fabrication of the semiconductor device;

DESCRIPTION OF THE INVENTION

The present invention is described by reference to the drawings.

Example I

A first example is described, which relates to a process of fabricating an MOS transistor gate electrode.

Figure 1A:
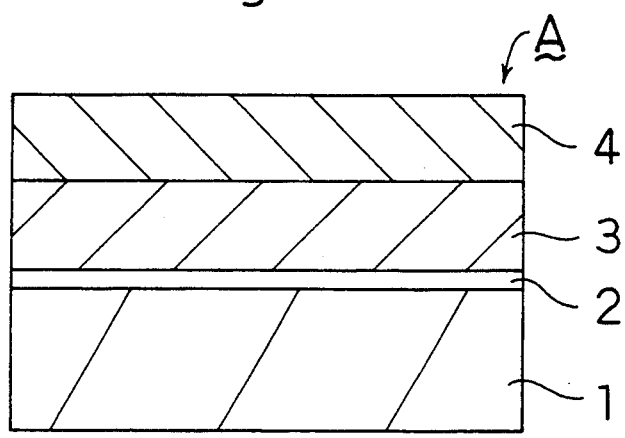
FIGS. 1A to 1B are cross sectional views of a semiconductor device of a first example of the invention, showing the steps in the fabrication of an gate electrode of the semiconductor device.

As shown in FIG. 1A, a silicon substrate 1 is subjected to an oxidizing process during which a gate silicon dielectric layer 2 composed of $SiO_2$ and having a thickness of 5 to 16 nm is grown on the silicon substrate 1. Formed on the surface of the gate dielectric layer 2 is a polysilicon layer 3 having a thickness of 5 to 200 nm. Then, from above the polysilicon layer 3, ions of gate impurities (for example, arsenic ions) are implanted into the polysilicon layer 3 at an implantation energy of 40 keV at a dose of $4 \times 10_{15}$ cm$^{-3}$. Next a tungsten silicide (WSix) layer 4 having a thickness of 50 to 200 nm is deposited on the surface of the polysilicon layer 3.

Figure 1B:
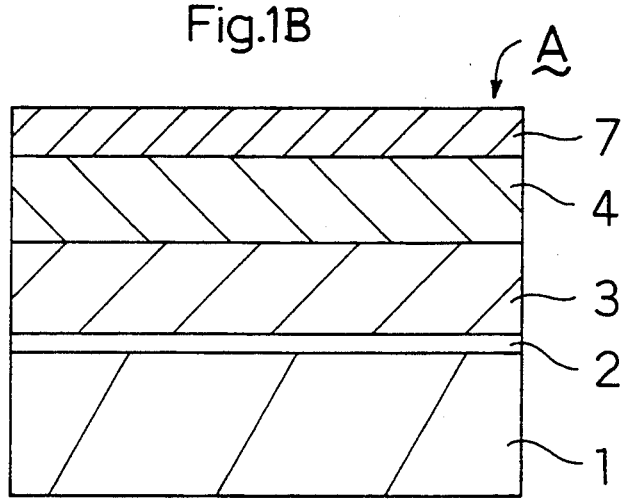

As shown in FIG. 1B, a Si-rich silicon oxide layer 7 which is rich in silicon content (50 to 200 nm thick) is formed on the surface of the WSix film 4 by means of a CVD process. This Si-rich silicon oxide layer 7 has such a silicon-to-oxygen composition ratio that it has a silicon content higher than the silicon-to-oxygen composition ratio of 1:2 according to the stoichiometric composition formula of $SiO_2$. Therefore, the composition of the Si-rich silicon oxide 7 is expressed by $SiO_{x1}$ (x1 = 1 to 1.5). This means that the $SiO_{x1}$ layer 7 is richer in silicon content in comparison with the silicon oxide layer 5 of the first conventional semiconductor device mentioned previously. In the former, the ratio of silicon to oxygen according to the stoichiometric composition formula is 1:2, while on the other hand, in the latter 1:1 to 1.5. The $SiO_{x1}$ layer 7 can be formed easily by, when carrying out a CVD process, adequately determining the flow rate of gas to be introduced into a reactor chamber. If reaction chamber process parameters for gas pyrolysis to deposit a layer are as follows: gas of $SiH_4$ flows at a rate of 0.1 lit. per minute, gas of $N_2O$ flows at a rate of 0.81 lit. per minute, pressure is 0.3 Torr, and temperature is 840° C., this deposits a layer of $SiO_2$ whose silicon-to-oxygen composition ratio is 1:2. If the flow rate of $N_2O$ is changed down to 0.4 to 0.6 lit. per minute with the other parameters unchanged, this results in the deposition of the $SiO_{x1}$ layer 7 whose silicon-to-oxygen composition ratio is 1:1 to 1.5.

Upon completion of the transferring of patterns, the polysilicon layer 3, the WSix film 4, and the $SiO_{x1}$ layer 7 are etched sequentially whereby a gate electrode is formed. At a later step, a heat treatment is carried out at 850° to 950° C. for the activation of the impurities, the crystallization of the WSix film 4, and the planarization of the interlevel layer.

Figure 2:
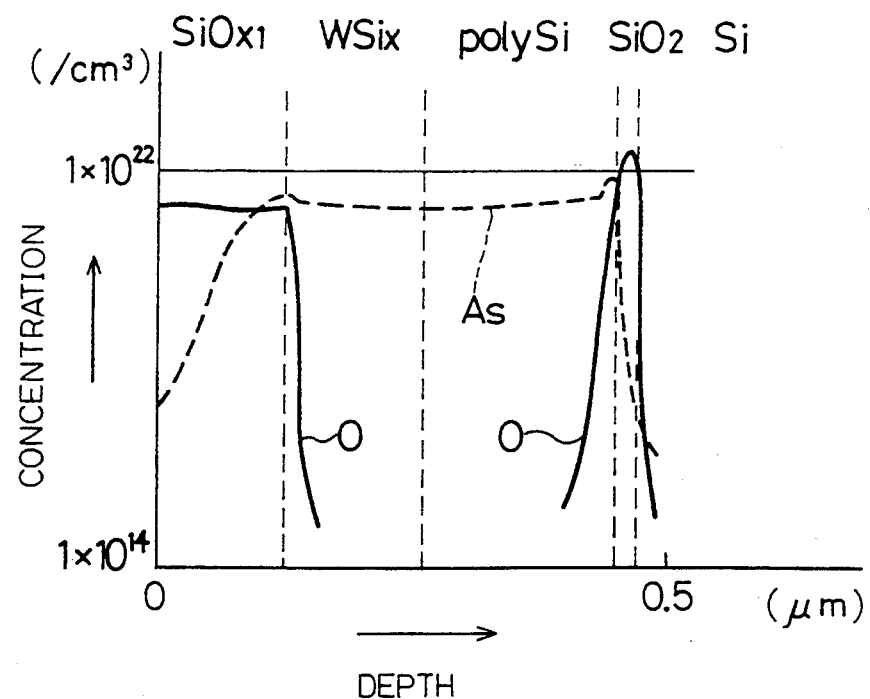
FIG. 2 shows the doping profile of n-type impurities in the first example.
Figure 17:
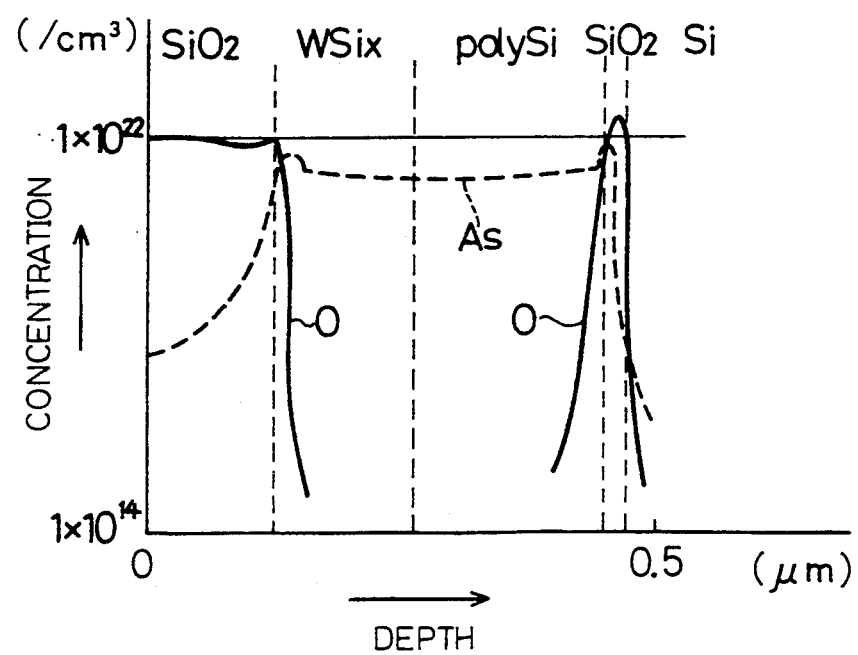
FIG. 17 shows the doping profile of impurities in the first conventional semiconductor device.
Figure 18:
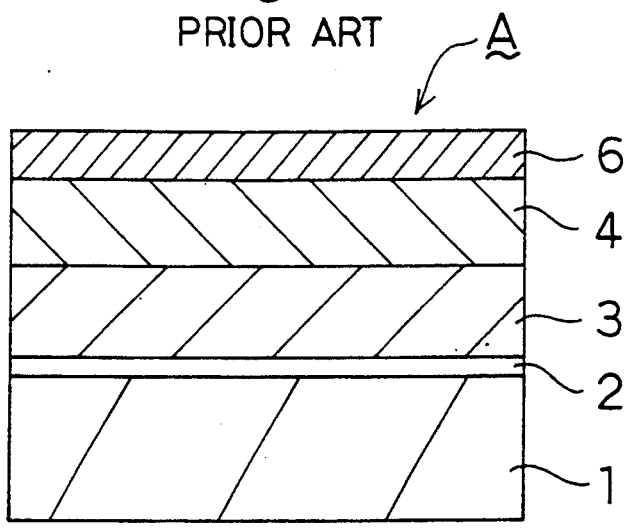
FIG. 18 shows in cross section a second conventional semiconductor device.
Figure 19:
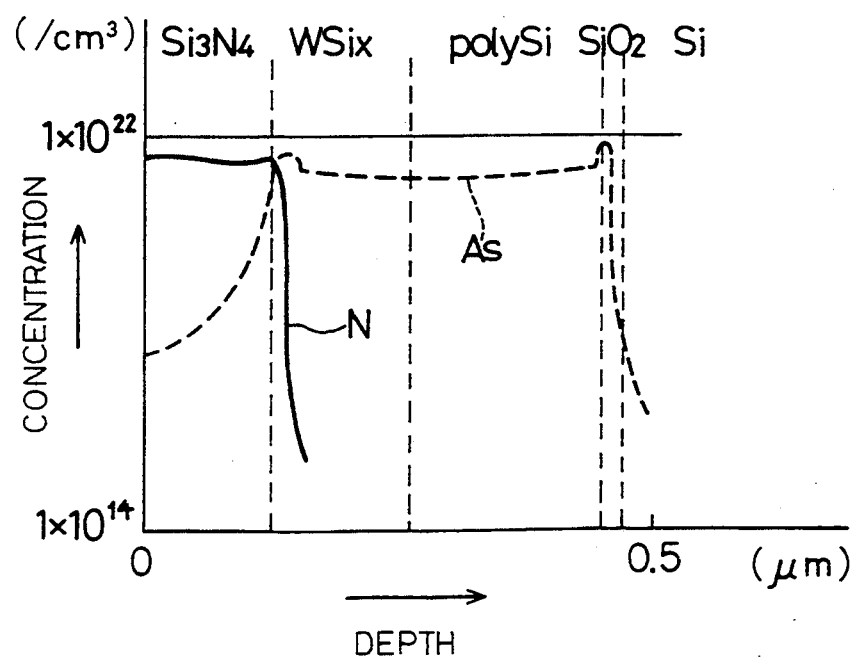
FIG. 19 shows the doping profile of impurities in the second conventional semiconductor device.

The doping profiles, from the $SiO_{x1}$ layer 7 to the silicon substrate 1, of oxygen and arsenic in a semiconductor device of the first example are illustrated in FIG. 2. The arsenic concentration at the $SiO_{x1}$–WSix interface is low compared to that at a corresponding zone of a conventional gate electrode (see FIG. 17).

The formation of the $SiO_{x1}$ layer 7 rich in silicon content on top of the WSix film 4 gives several advantages. If a silicon oxide layer, which is formed by the silicon-to-oxygen composition ratio according to the stoichiometric composition formula of $SiO_2$, is formed on a WSix film, gate impurities from the WSix film find it hard to be diffused into the silicon oxide layer because the silicon-to-oxygen bond is stable. As a result such gate impurities aggregate at the WSix–$SiO_2$ interface. Conversely, in accordance with the present example, it is possible for the gate impurity diffused from below to be bonded to silicon with no chemical bond to oxygen and with vacancies for further chemical bond, in the $SiO_{x1}$ layer 7. As a result the concentration of gate impurity scattering around the interface becomes decreased, so that, in the vicinity of the interface, the tungsten is likely to react with the silicon. This assures good adhesion between the WSix film 4 and the $SiO_{x1}$ layer 7. Since there exists a small difference in heat shrinkage between the WSix film 4 and the $SiO_{x1}$ layer 7, the interface between these layers is less stressed during a heat treatment. Peeling is unlikely to occur, accordingly.

Additionally, since peeling is avoidable although the concentration of gate impurity to be implanted into the polysilicon layer 3 exceeds conventional limits, this eliminates the need for controlling a gate impurity dose. The depletion of a gate in an MOS semiconductor device is prevented.

Since the silicon content of the WSix film 4 remains unchanged, contact resistance with respect to a wiring metal will not increase.

A semiconductor device provided with a MOS transistor is used to describe the first example. The present example, of course, finds applications in semiconductor devices provided with a bipolar transistor. For the case of bipolar transistors, if an emitter electrode is given a structure of this example (a metal silicide film, a polysilicon layer, and a Si-rich silicon oxide layer), this eliminates the need for controlling the dose of emitter impurity. It is therefore possible to increase the rate of current amplification of an n-p-n transistor.

Ion implantation of boron (p-type impurity) in the present example is now explained.

Figure 3:
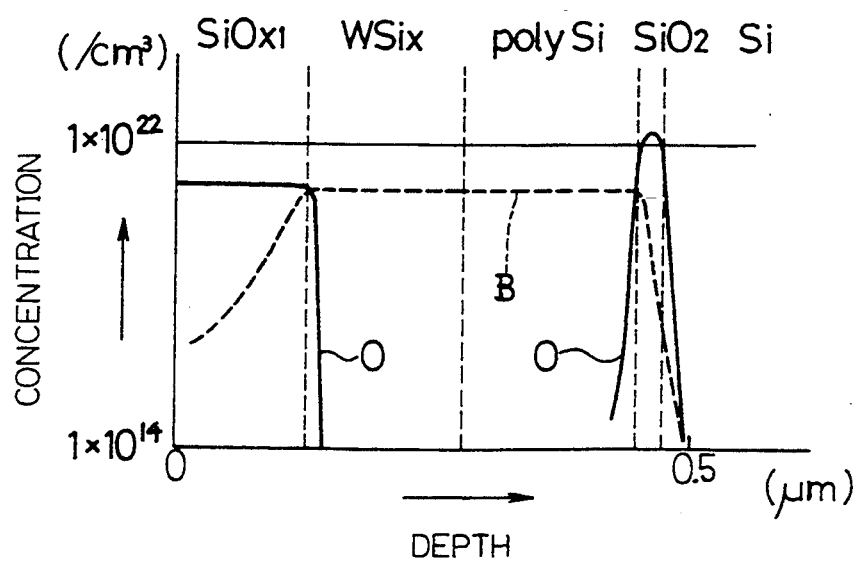
FIG. 3 shows the doping profile of p-type impurities in the first example.
Figure 20:
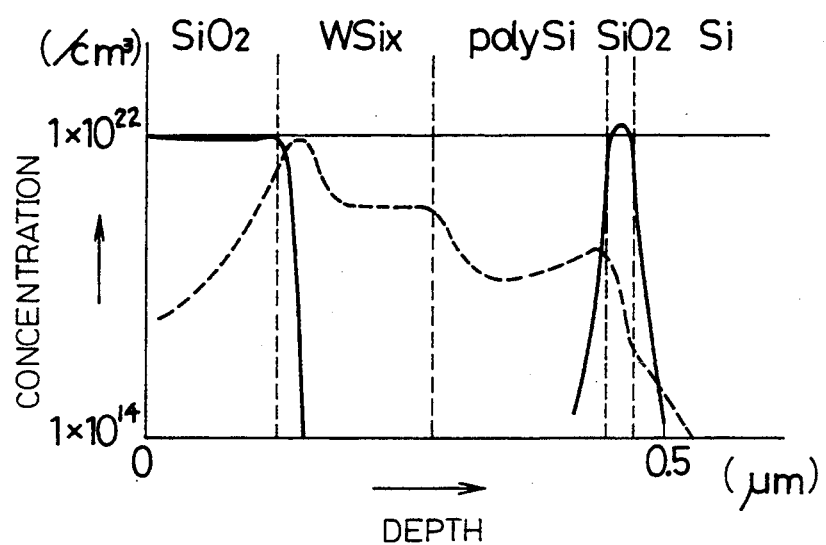
FIG. 20 shows the doping profile of p-type impurities in the conventional semiconductor device.

FIG. 3 shows the doping profiles of boron and oxygen in the case of carrying out an ion implantation of boron at an implantation energy of 10 keV at a dose of $4 \times 10_{15}$ cm$^{-3}$. As seen from FIG. 3, the boron concentration does not increase with a peak occurring at the WSix–$SiO_{x1}$ interface compared to the one as shown in FIG. 20. It is understood that no impurities collect in the interface. Additionally, the need for reducing the dose of boron ion is eliminated, although in the prior art techniques the dose of boron ion must be reduced to control the aggregation of impurities towards the interface. Because of this advantage, the concentration of impurity in the polysilicon layer 3 can be kept sufficiently high.

EXAMPLE II

Figure 4:
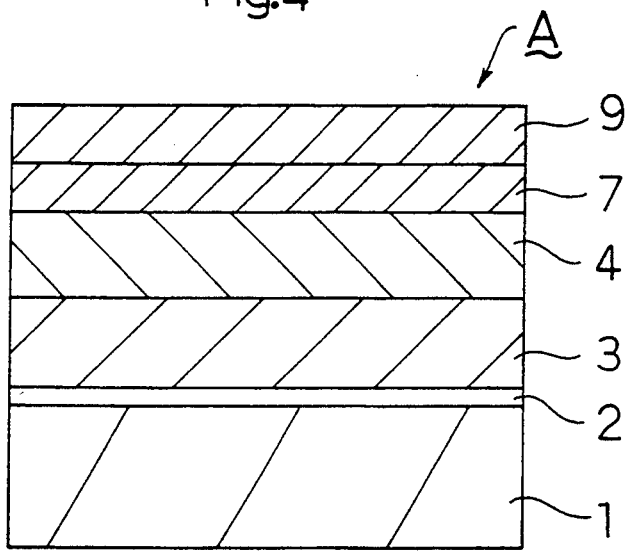
FIG. 4 is a cross sectional view of a semiconductor device of a second example of the invention, showing the step in the fabrication of an gate electrode of the semiconductor device.
Figure 5:
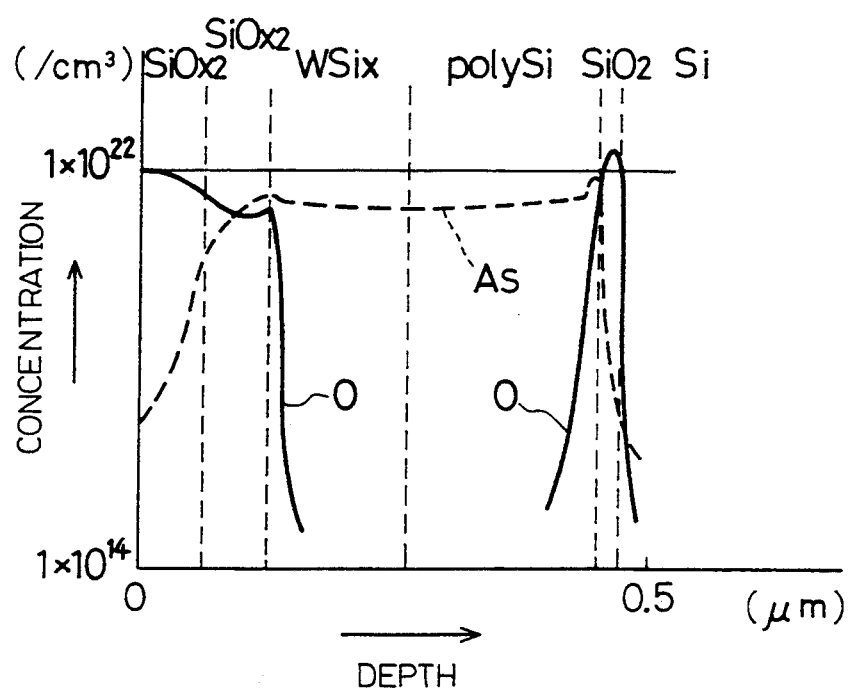
FIG. 5 shows the doping profile of impurities in the second example.

A second example of the invention is described by referring to FIGS. 4 and 5.

FIG. 4 shows in cross section a semiconductor device provided with a MOS transistor in accordance with the second example. In the second example, tile gate dioxide layer 2, the polysilicon layer 3, and the WSix film 4 are formed in the same steps as in the first example (see FIG. 1A).

In the second example, the $SiO_{x1}$ layer 7 (x1 = 1 to 1.5; 30 to 100 nm thick) is formed on top of the WSix film 4 by a CVD process. Then, a silicon oxide layer 9 ($SiO_{x2}$; x2 = 1.5 to 2), which serves as a passivation film and has a thickness of 50 to 100 nm, is deposited on the surface of the $SiO_{x1}$ layer 7. The $SiO_{x2}$ layer 9 has a composition closer to a composition according to the stoichiometric composition formula of silicon dioxide ($SiO_2$) as compared to the $SiO_{x1}$ layer 7. Both the $SiO_{x1}$ layer 7 and the $SiO_{x2}$ layer 9 can be formed easily by, when carrying out a CVD process, adequately determining the flow rate of gas to be introduced into a reactor chamber. If reaction chamber process parameters for gas pyrolysis to deposit a layer are as follows: gas of $SiH_4$ flows at a rate of 0.1 lit. per minute, gas of $N_2O$ flows at a rate of 0.4 to 0.6 lit. per minute, pressure is 0.3 Torr, and temperature is 840° C., this deposits the $SiO_{x1}$ layer 7. Upon the deposition of the $SiO_{x1}$ layer 7, if the flow rate of $N_2O$ is changed up to 0.6 to 0.8 lit. per minute with the other parameters unchanged, this results in the deposition of the $SiO_{x2}$ layer 9 on the $SiO_{x1}$ layer 7. In other words, it is possible to continuously carry out the deposition of the $SiO_{x2}$ layer r9 after the deposition of $SiO_{x1}$ layer 7 at a single step by merely changing the flow rate of $N_2O$ in the same deposition sequence.

Next, mask patterning is carried out, after which a gate electrode is formed by sequentially subjecting the polysilicon layer 3, the WSix film 4, and the silicon oxide layer 5 to an etching treatment. Further, at a later step, a heat treatment is carried out at 850° to 950° C. for the activation of the impurities, the crystallization of the WSix film 4, and the planarization of the interlevel layer.

FIG. 5 shows the doping profiles of oxygen and arsenic from the $SiO_{x2}$ layer 9 to the silicon substrate 1 in a semiconductor device in accordance with the second example. At the WSix–$SiO_{x1}$ interface, the arsenic concentration is low compared to the conventional techniques, and the arsenic does not aggregate in the $SiO_{x-1}$–$SiO_{x2}$ interface.

Also in the second example, the $SiO_{x1}$ layer 7, which is rich in silicon content, is formed on the WSix film 4. This results in good adhesion between these layers. Furthermore, the difference in heat shrinkage between them is small, which means that the WSix–$SiO_{x1}$ interface is less stressed during a heat treatment. Accordingly, peeling is prevented.

Further, since the $SiO_{x2}$ layer 9 whose composition is close to a composition according to the stoichiometric composition formula of silicon dioxide is formed on the $SiO_{x1}$ layer 7, this prevents the outward diffusion of arsenic as gate impurities and tungsten. Within the $SiO_{x2}$ layer 9, the silicon-oxygen bond is stable compared to within the $SiO_{x1}$ layer 7, as a result of which oxygen and impurities from the outside do not excessively enter the WSix film 4. This prevents tungsten of the WSix film 4 from being oxidized, which means that the electrical resistance does not fall. A gate oxide layer and the inside of an electrode do not get degraded by impurities from the outside when an ion implantation is carried out.

EXAMPLE III

A third example is described by reference to FIGS. 6 and 7.

Figure 6:
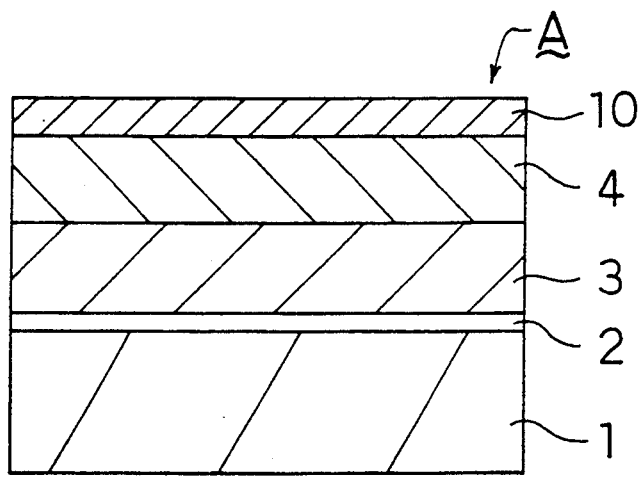
FIG. 6 is a cross sectional view of a semiconductor device of a third example of the invention.

FIGS. 6 shows in cross section the fabrication step of a semiconductor device in accordance with the third example. In the present example, the gate dielectric layer 2, the polysilicon layer 3, and the WSix film 4 are formed in the same process as in the first example.

As shown in FIG. 6, a Si-rich silicon nitride layer 10 ($SiN_{y1}$; y1=0.8 to 1) of a rich-in-silicon type having a thickness of 50 to 200 nm is formed on the surface of the WSix film 4 by means of a CVD process. This $SiN_{y1}$ layer 10 has a silicon content higher than a silicon content according to the stoichiometric composition formula of silicon nitride ($Si_3N_4$). The $SiN_{y1}$ layer 10 can be formed easily by, when carrying out a CVD process, adequately determining the flow rate of gas to be introduced into a reactor chamber. If reaction chamber process parameters for gas pyrolysis to deposit a layer are as follows: gas of $SiH_2Cl_2$ flows at a rate of 0.7 lit. per minute, gas of $NH_3$ flows at a rate of 0.7 lit. per minute, pressure is 0.25 Torr, and temperature is 760° C., this deposits a layer of $Si_3N_4$ whose silicon-to-nitrogen composition rate is three to four. If the flow rate of $NH_3$ is changed down to 0.3–0.5 lit. per minute with the other parameters unchanged, this results in the deposition of the $SiN_{y1}$ layer 10 having a Si-to-N ratio of 1:0.8–1.0.

Upon completion of the transferring of patterns, the polysilicon layer 3, the WSix film 4, and the $SiN_{y1}$ layer 10 are sequentially selectively etched whereby a gate electrode is formed. At a later step, a heat treatment is carried out at 850° to 950° C. for the activation of the impurities, the crystallization of the WSix film 4, and the planarization of the interlevel layer.

Figure 7:
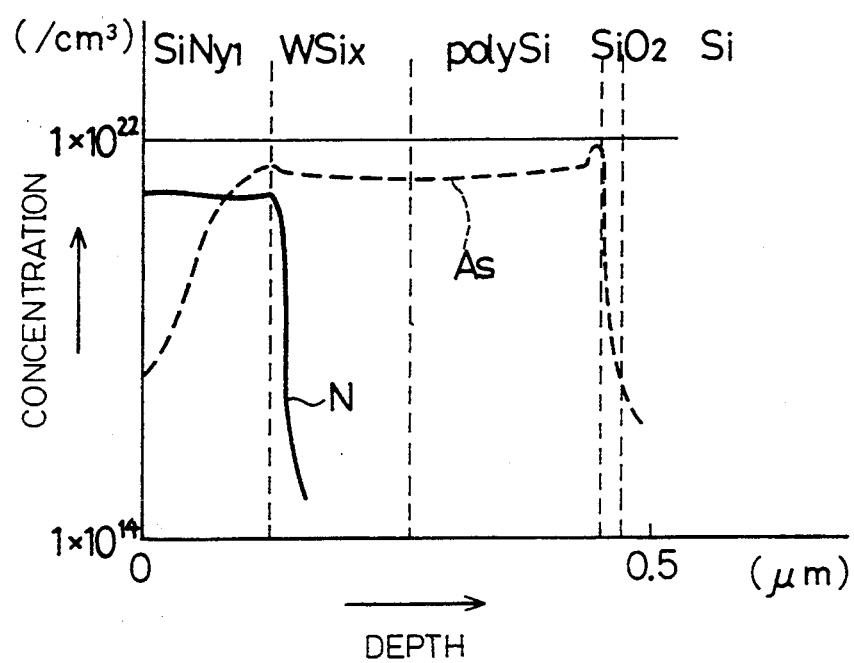
FIG. 7 shows the doping profile of impurities in the third example.

The doping profiles of nitrogen and arsenic from the $SiN_{y1}$ layer 10 towards the silicon substrate 1 in a semiconductor device of the third example are illustrated in FIG. 7. The concentration of arsenic at the interface between the $SiN_{y1}$ layer 10 and the WSix film 4 is low compared to the conventional semiconductor techniques.

The formation of the $SiN_{y1}$ layer 10 on top of the WSix film 4 gives several advantages. For example, it is possible for the gate impurity in the WSix film 4 to be bonded to silicon with vacancies for further chemical bond and without any chemical bond to nitrogen, in the $SiN_{y1}$ layer 10. The concentration of gate impurity aggregated in the interface decreases, since gate impurities diffused from the WSix film 4 can easily be diffused into the $SiN_{y1}$ layer 10. Accordingly, in the vicinity of the interface, tungsten is most likely to react with silicon. This assures good adhesion between the WSix film 4 and the $SiN_{y1}$ layer 10. Since there exists a small difference in heat shrinkage between the WSix film 4 and the $SiN_{y1}$ layer 10, possible stress applied to the interface is reduced. Peeing is unlikely to occur, accordingly.

In accordance with the present example, the degradation in characteristic of a MOS semiconductor device caused by the depletion of a gate can be prevented, and it is possible to increase the rate of current amplification of an n-p-n transistor.

EXAMPLE IV

Figure 8:
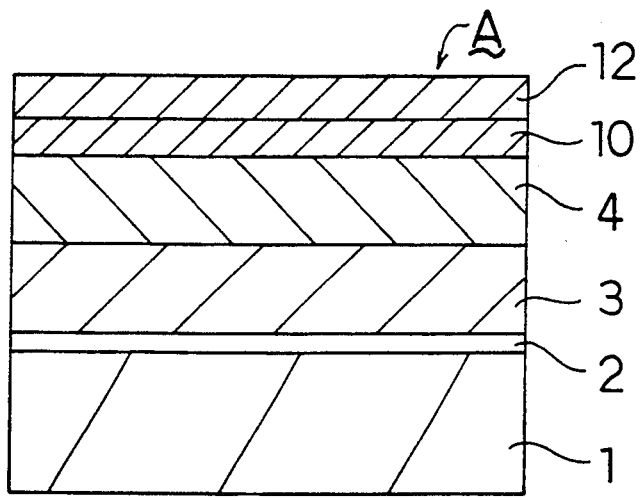
FIG. 8 is a cross sectional view of a semiconductor device of a fourth example of the invention.
Figure 9:
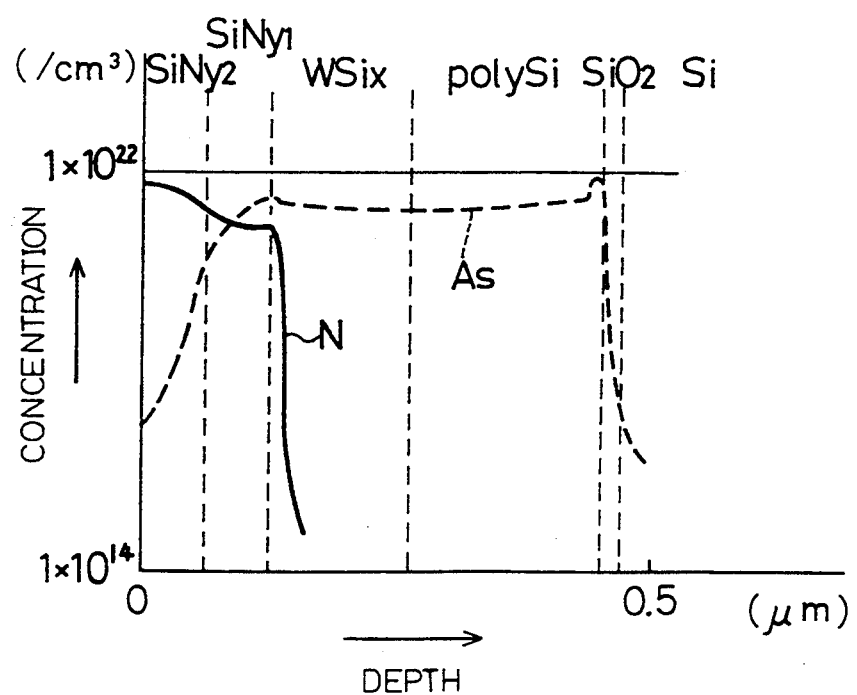
FIG. 9 shows the doping profile of impurities in the fourth example.

A fourth example of the invention is described by referring to FIGS. 8 and 9.

FIG. 8 shows in cross section a semiconductor device in accordance with this example. The gate dielectric layer 2, the polysilicon layer 3, and the WSix film 4 are formed in the same process as in the first example.

In the present example, the Si-rich $SiN_{y1}$ layer 10 (y1=0.8 to 1.0) having a thickness of from 50 to 200 nm is formed on top of the WSix film 4. A silicon nitride layer 12 having a thickness of 50 to 100 nm and serving as a passivation film is deposited on the surface of the $SiN_{y1}$ layer 10 by means of a CVD process. This silicon nitride layer 12 is expressed by $SiN_{y2}$ where y2=1 to 1.33, thereby having a silicon-to-nitride composition ratio closer to a silicon-to-nitride composition ratio according to the stoichiometric composition formula of $Si_3N_4$, compared to the Si-rich $SiN_{y1}$ layer 10 (y1=0.8 to 1.0). Both the $SiN_{y1}$ layer 10 and the $SiN_{y2}$ layer 12 can be formed easily by, when carrying out a CVD process, adequately determining the flow rate of gas to be introduced into a reactor chamber. If reaction chamber process parameters for gas pyrolyisis to deposit a layer are as follows: gas of $SiH_2Cl_2$ flows at a rate of 0.07 lit. per minute, gas of $NH_3$ flows at a rate of 0.3 to 0.5 lit. per minute, pressure is 0.25 Torr, and temperature is 760° C., this deposits the Si-rich $SiN_{y1}$ layer 10. Upon completion of the deposition of the Si-rich $SiN_{y1}$ layer 10, if the flow rate of $NH_3$ changed to 0.5 to 0.7 lit. per minute with the other parameters unchanged, this results in depositing the $SiN_{y2}$ layer 12 on the Si-rich $SiN_{y1}$ layer 10. In other words, it is possible to continuously carry out the deposition of the Si-rich $SiN_{y1}$ layer 10 and the deposition of the $SiN_{y2}$ layer 12 by a single step by merely changing the flow rate of $NH_3O$ gas in the same deposition sequence.

Next, patterning is carried out, after which a gate electrode is formed by sequentially subjecting the polysilicon layer 3, the WSix film 4, and the silicon oxide layer 5 to etching. Further, at a later step, a heat treatment is carried out at 850° to 950° C. for the activation of the impurities, the crystallization of the WSix film 4, and the planarization of the interlevel layer.

FIG. 9 shows the doping profiles of nitrogen and arsenic from the $SiN_{y2}$ layer 12 toward the silicon substrate 1 in a semiconductor device in accordance with the fourth example. At the WSix–$SiN_{y1}$ interface, the arsenic concentration is low compared to the conventional technique.

Also in the fourth example, the Si-rich $SiN_{y1}$ layer 10 is formed on the WSix film 4. The same effect as the third example can be expected, accordingly. Furthermore, the provision of the $SiN_{y2}$ layer 12 on top of the Si-rich $SiN_{y1}$ layer 10 gives several advantages as follows.

Because of the $SiN_{y2}$ layer 12, the outward diffusion of gate impurities and tungsten from the WSix film 4 is prevented. Within the $SiN_{y2}$ layer 12, the silicon-oxygen bond is stable compared to that within the Si-rich $SiN_{y1}$ layer 10, as a result of which oxygen from the outside will not excessively be diffused into the WSix film 4. This prevents tungsten contained in the WSix film 4 from being oxidized, which means that the drop in electrical resistance is prevented. The inside of an electrode and a gate oxide layer are thus free from degradation due to impurities from the outside.

EXAMPLE V

A fifth example of tile invention is described by reference to FIGS. 10A to 10C.

As shown in FIG. 10A, like the first example, (1) the silicon substrate 1 is subjected to an oxidizing treatment during which the gate silicon dielectric layer 2 having a thickness of 5 to 16 nm is grown on the surface of the silicon substrate 1, (2) the polysilicon layer 3 having a thickness of 5 to 200 nm and the WSix film 4 having a thickness of 50 to 200 nm are formed, and (3) the Si-rich $SiO_{x1}$ layer 7 (20 to 50 nm thick; $x1=1$ to 1.5) is formed on the surface of the WSix film 4 by a CVD process.

Next, from above the silicon substrate 1, ion implantation of, for example, arsenic as gate impurities is carried out at an implantation energy of 40 keV at a dose of $4 \times 10^{15}$ cm$^{-3}$ (see FIG. 10B).

Next, the surface of the Si-rich $SiO_{x1}$ layer 7 is subjected to an oxidizing process in an electric furnace at a temperature of 850° C. for 20 minutes for increasing the oxygen content. In other words, the upper portion of the Si-rich $SiO_{x1}$ layer 7 is changed to the $SiO_{x2}$ layer 9 (10 to 30 nm thick; $x2=1.5$ to 2) whose composition is close to a composition according to the stoichiometric composition formula of $SiO_2$. At this point, the implanted gate impurities are diffused into the polysilicon layer 3 to become active, and the structures of the WSix film 4 and the $SiO_{x1}$ layer 7, which have been disordered by the ion implantation, are restored.

Upon completion of the transferring of patterns, the polysilicon layer 8, the WSix film 4, the Si-rich $SiO_{x1}$ layer 7, and the $SiO_{x2}$ layer 9 are etched sequentially whereby a gate electrode is formed. At a later step, a heat treatment is carried out at 850° to 950° C. for the activation of the impurities, the crystallization of the WSix film 4, and the planarization of the interlevel layer.

Although not shown, the doping profiles of oxygen and arsenic from the $SiO_{x2}$ layer 9 towards the silicon substrate 1 in a semiconductor device of the fifth example are the same as shown in FIG. 4. The concentration of arsenic at the $SiO_{x1}$–WSix interface is low compared to the conventional technique.

The present example gives the same advantages that the first and second examples do, and it further presents the following advantage.

If an ion implantation is carried out directly to the WSix film 4, this roughens the surface of the WSix film 4, leaving such a roughened surface exposed. Consequently, it is very likely that abnormal oxidization will occur during a later heat treatment or oxidizing step. Conversely, in the present example, the foregoing problem is eliminated, since impurity ions are implanted into the WSix layer 4, with the surface of the WSix film 4 covered with the Si-rich $SiO_{x1}$ layer 7. This prevents abnormal oxidization from taking place at a later heat treatment and a later oxidizing step, therefore contributing to improving the quality of semiconductor devices.

EXAMPLE VI

A sixth example of the invention is explained by reference to FIGS. 11A to 11C.

Figure 11A:
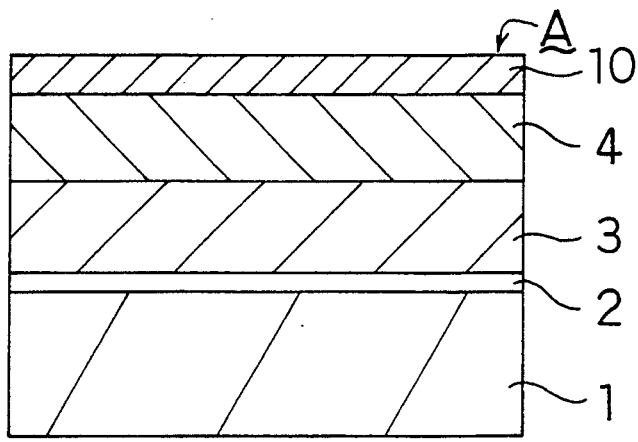
FIGS. 11A to 11C are cross sectional views of a semiconductor device of a sixth example of the invention, showing the steps in the fabrication of the semiconductor device.
Figure 11B:
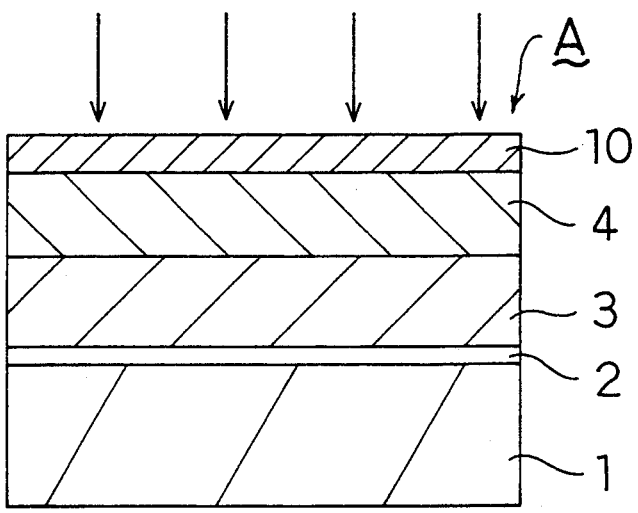
Figure 11C:
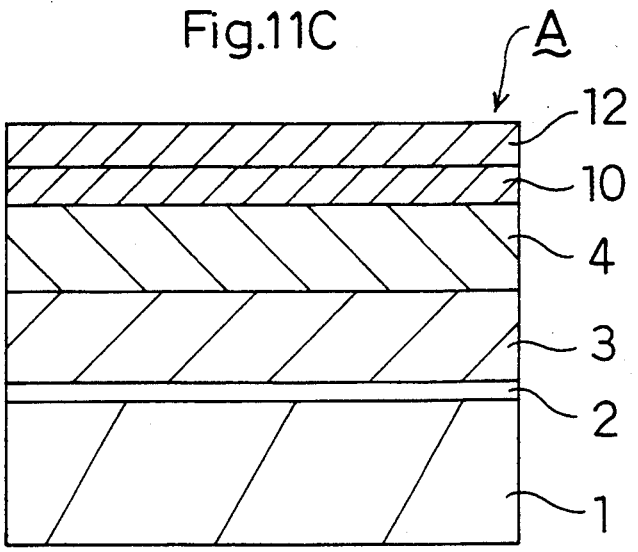

FIGS. 11A to 11C are cross sectional views illustrating the steps of the fabrication of a semiconductor device incorporating a MOS transistor in accordance with the sixth example. Like the second example, the gate dielectric layer 2, the polysilicon layer 3, and the WSix film 4 are formed on the silicon substrate 1 in order. The Si-rich $SiN_{y1}$ layer 10 ($y1=0.8$ to 1; 20 to 30 nm thick) is formed on top of the WSix film 4 by a CVD process, as in the second example. The Si-rich $SiN_{y1}$ layer 10 can easily be formed by adequately determining the flow rate of gas the process of which is the same as described in the third example.

Next, from above the silicon substrate 1, an ion implantation of, for example, arsenic as gate impurities is carried out at an implantation energy of 40 keV at a dose of $4 \times 10^{15}$cm$^{-3}$ (see FIG. 11B).

Next, the surface of the Si-rich $SiN_{y1}$ layer 10 is subjected to an oxidizing treatment in an electric furnace at a temperature of 850° C. for 20 minutes for increasing the nitrogen content. In other words, the upper portion of the Si-rich $SiN_{y1}$ layer 10 is changed to the $SiN_{y2}$ layer 12 (10 to 20 nm thick; $y2=1$ to 1.33) whose composition is close to a composition according to the stolchiometric composition formula of silicon nitride $Si_3N_4$. At this point, the implanted gate impurities are diffused into the polysilicon layer 3 to become active, and the structures of the WSix film 4 and the $SiN_{y1}$ layer 10, which have been disordered by the ion implantation, are restored.

Upon completion of the transferring of patterns, the polysilicon layer 3, the WSix film 4, and the Si-rich SiN$_{y1}$ layer 10, and the SiN$_{y2}$ layer 12 are etched in order whereby a gate electrode is formed. At a later step, a heat treatment is carried out at from 850° to 950° C. for the activation of the impurities, the crystallization of the WSix film 4, and the planarization of the interlevel layer.

Although not shown, the doping profiles of nitrogen and arsenic from the SiN$_{y2}$ layer 12 towards the silicon substrate 1 in a semiconductor device of the sixth example are the same as shown in FIG. 8. The concentration of arsenic at the SiN$_{y1}$–WSix interface is low compared to the conventional technique.

The present example gives the same advantages that the fourth example does, and it further presents the following advantage.

If an ion implantation is carried out directly to the WSix film 4, this roughens the surface of the WSix film 4, leaving such a roughened surface exposed. Consequently, it is likely that abnormal oxidization will occur during a later heat treatment or oxidizing step. Conversely, in the present example, the foregoing problem is eliminated, since impurity ions are implanted into the WSix layer 4, with the surface of the WSix film 4 covered with the Si-rich SiN$_{y1}$ layer 10. This prevents abnormal oxidization from taking place at a later heat treatment, and at a later oxidizing step.

EXAMPLE VII

A seventh example of the invention is described by reference to FIGS. 12 and 13.

Figure 12:
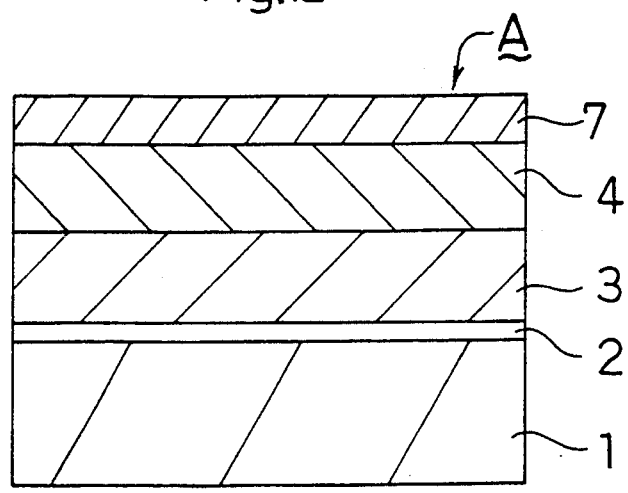
FIG. 12 shows in cross section a semiconductor device of a seventh example of the invention.
Figure 13:
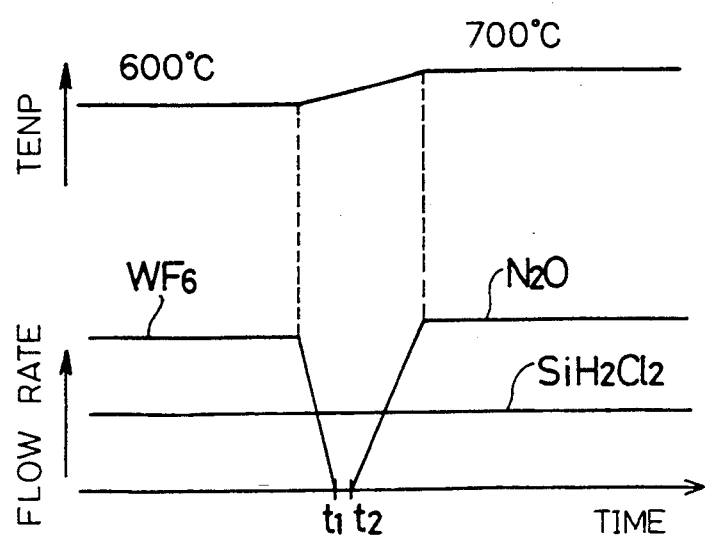
FIG. 13 shows the change in deposition temperature as well as the change in gas flow rate with time during the steps in the fabrication of a semiconductor device of the seventh example.

FIG. 12 is a cross sectional view of a semiconductor device incorporating a MOS transistor in accordance with the present example. The gate dielectric layer 2 and the polysilicon layer 3 are formed on top of the silicon substrate 1. Then, the silicon substrate 1 is subjected to an ion implantation with, for example, arsenic ions as gate impurities using the same ion implantation parameters as employed in the first example.

In a CVD reactor chamber, (1) the WSix film 4 having a thickness of from 50 to 200 nm is formed, and (2) deposited on the surface of the WSix film 4 is the Si-rich SiO$_{x1}$ layer 7 which has a silicon content higher than a silicon content according to the stoichiometric composition formula of SiO$_2$. When forming both the WSix film 4 and the Si-rich SiO$_{x1}$ layer 7, SH$_2$Cl$_2$ gas is used as a partial material of these two layers.

More specifically, the WSix film 4 is formed by means of pyrolysis of mixed gases of SH$_2$Cl$_2$ gas with WF$_6$ gas at a temperature of from 500° to 600° C. (until t1 in FIG. 13). Then, with the silicon slice still placed in the reactor chamber, (1) the supply of WF$_6$ gas is brought to a halt, (2) at the same time, the chamber temperature is increased up to 650° to 700° C., and (3) N$_2$O gas is introduced into the chamber at a flow rate of 0.4 to 0.6 lit. per minute (from t2 in FIG. 13). In this way, the Si-rich SiO$_{x1}$ layer 7 with a silicon-to-oxygen ratio of 1:1 to 1.5 is deposited. Although not shown in FIG. 13, SH$_2$Cl$_2$ gas is introduced in the chamber not only at the step of forming the WSix film 4 but also at the step of depositing the Si-rich SiO$_{x1}$ layer 7.

Next, patterning is carried out after which a gate electrode is formed by sequentially subjecting the polysilicon layer 3, the WSix film 4, and the Si-rich SiO$_{x1}$ layer 7 to etching processing. Further, at a later step, a heat treatment is carried out at 850° to 950° C. for the activation of the impurities, the crystallization of the WSix film 4, and the planarization of the interlevel layer.

Since both the WSix film 4 and the Si-rich SiO$_{x1}$ layer 7 are formed by means of pyrolysis of mixed gases including SH$_2$Cl$_2$ gas, this gives these two layers almost the same deposition temperature. As a result the difference in heat shrinkage between the WSix film 4 and the Si-rich SiO$_{x1}$ layer 7 becomes smaller, and the interface is less stressed so that film peeing is unlikely to occur.

Further, in the present example, the deposition of the WSix film 4 and the deposition of the Si-rich SiO$_{x1}$ layer 7 are continuously carried out in the same deposition reactor. This makes it possible to cover the surface of the WSix film 4 with a dielectric layer, without exposing it to the atmosphere, before grain growth by crystallization starts. Thus, the WSix film 4 becomes free from abnormal oxidization.

EXAMPLE VIII

An eighth example of the invention is described by reference to FIGS. 14 and 15.

Figure 14:
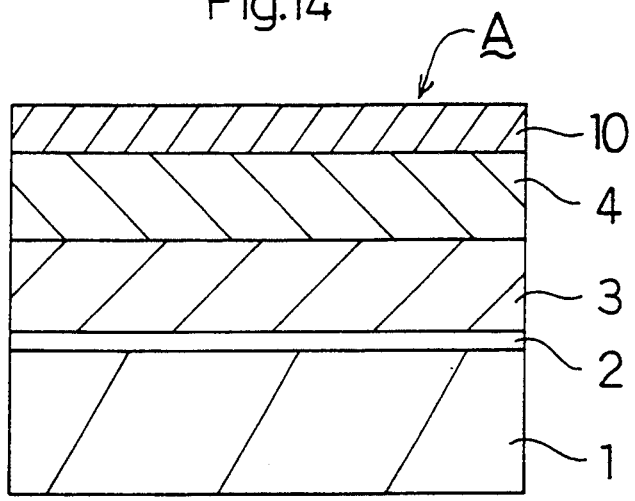
FIG. 14 shows in cross section a semiconductor device of an eighth example of the invention.
Figure 15:
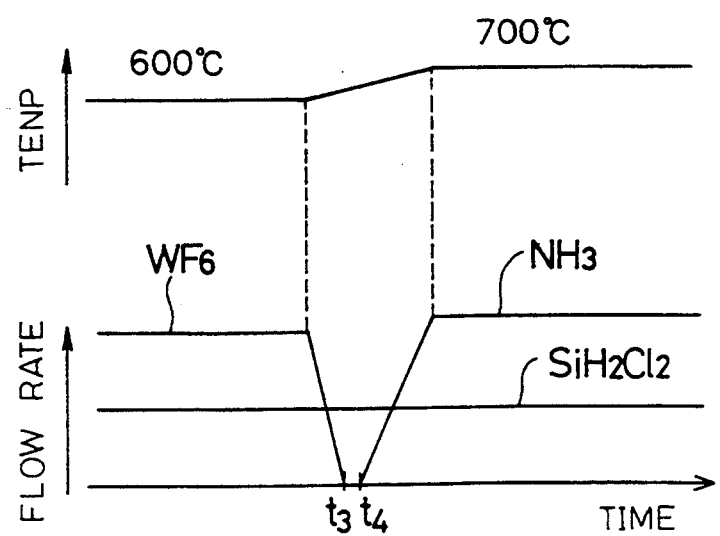
FIG. 15 shows the change in deposition temperature as well as the change in gas flow rate with time during the steps in the fabrication of a semiconductor device of the eighth example.
Figure 16:
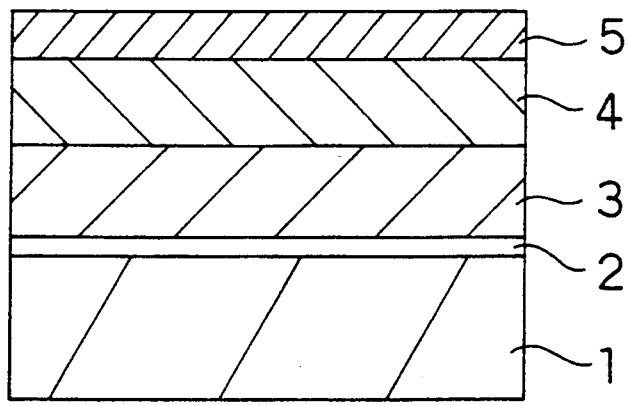
FIG. 16 shows in cross section a first conventional semiconductor device.

FIG. 14 is a cross sectional view of a semiconductor device incorporating a MOS transistor in accordance with the present example. The gate dielectric layer 2 and the polysilicon layer 3 are formed on top of the silicon substrate 1. Then, the silicon substrate 1 is subjected to an ion implantation with, for example, arsenic ions as gate impurities using the same ion implantation parameters as employed in the first example.

In a CVD reactor chamber, (1) the WSix film 4 having a thickness of from 50 to 200 nm is formed, and (2) deposited on the surface of the WSix film 4 is the Si-rich SiN$_{y1}$ layer 10 which has a silicon content higher than a silicon content according to the stoichiometric composition formula of SiO$_3$N$_4$. When forming both the WSix film 4 and the SiN$_{y1}$ layer 10, SH$_2$Cl$_2$ gas is used as a partial material of these two layers.

More specifically, the WSix film 4 is formed by means of pyrolysis of mixed gases of SH$_2$Cl$_2$ gas and WF$_6$ gas at a temperature of from 500° to 600° C. (until t3 in FIG. 15). Then, with the silicon slice still placed in the chamber, (1) the supply of WF$_6$ gas is brought to a stop (2) at the same time, the chamber temperature is increased up to 650° to 700° C., and (3) NH$_3$ gas is introduced into the chamber at a flow rate of 0.3 to 0.5 lit. per minute (from t4 in FIG. 13). In this way, the Si-rich SiN$_{y1}$ layer 10 with a silicon-to-oxygen ratio of 1:0.8 to 1 is grown. SH$_2$Cl$_2$ gas is continuously introduced into the chamber at the step of forming the WSix film 4, and at the step of depositing the SiN$_{y1}$ layer 7.

Next, patterning is carried out, after which a gate electrode is formed by sequentially subjecting the polysilicon layer 3, the WSix film 4, and the SiN$_{y1}$ layer 10 to etching. Further, at a later step, a heat treatment is carried out at 850° to 950° C. for the activation of the impurities, the crystallization of the WSix film 4, and the planarization of the interlevel layer.

Since both the WSix film 4 and the SiN$_{y1}$ layer 10 are formed by mixed gases including SH$_2$Cl$_2$ gas, this allows these two layers to be deposited at almost the same temperature. As a result the difference in heat shrinkage between the WSix film 4 and the SiN$_{y1}$ layer 10 becomes smaller, and the interface is less stressed so that film peeing is unlikely to occur.

Further, in the present example, the deposition of the WSix film 4 and the deposition of the SiN$_{y1}$ layer 10 are continuously carried out in the same reactor chamber. This makes it possible to cover the surface of the WSix film 4 with a dielectric layer, without exposing it to the atmosphere, before grain growth by crystallization starts. Thus, the WSix film 4 becomes free from abnormal oxidization.

The invention claimed is:

1. A semiconductor device comprising:
   (a) a metallic silicide film, said metallic silicide film being formed above a semiconductor substrate and being composed of a first chemical compound of silicon and a metal element having a high melting point such as tungsten, molybdenum, and titanium, and
   (b) a dielectric layer formed on said metallic silicide film, said dielectric layer being composed of a second chemical compound of silicon and a different element, and having a silicon content higher than the silicon content according to the stoichiometric composition formula of the second chemical compound.

2. A semiconductor device as in claim 1, further comprising a polysilicon layer which is formed above said semiconductor substrate,
   wherein:
   (a) said metallic silicide film is deposited on said polysilicon layer, and
   (b) said polysilicon layer and said metallic silicide film as one integral body function as an electrode or as a wire.

3. A semiconductor device as in either claim 1 or claim 2, further comprising a dielectric layer for passivation, said passivation dielectric layer being formed on said dielectric layer type, being composed of a chemical compound which is the same compound that said dielectric layer is composed of, and having a silicon content closer to a silicon content according to the stoichiometric composition formula, compared to the dielectric layer.

4. A semiconductor device as in either claim 1 or claim 2, wherein the silicon content of said dielectric layer becomes increasingly less rich in silicon content and approaches the stoichiometric composition formula in a direction from the bottom to the top thereof.

5. A semiconductor device as in either claim i or claim 2, wherein said dielectric layer is a silicon oxide layer whose stoichiometric composition formula is $SiO_2$ with an excessive silicon content.

6. A semiconductor device as in either claim 1 or claim 2, wherein said dielectric layer is a silicon nitride layer whose stoichiometric composition formula is $Si_3N_4$ with an excessive silicon content.

7. A semiconductor device as in claim i wherein said semiconductor device is a CMOS transistor, further comprising:
   (a) a gate dielectric layer which is formed on said semiconductor substrate, and
   (b) a polysilicon layer which formed on said gate dielectric layer,
   wherein said metallic silicide film is deposited on said polysilicon layer, and said polysilicon layer and said metallic silicide film function as a gate electrode of said CMOS transistor.

* * * * *